US008128714B2

(12) United States Patent
Ro et al.

(10) Patent No.: US 8,128,714 B2
(45) Date of Patent: Mar. 6, 2012

(54) APPARATUS FOR MANUFACTURING POLYCRYSTALLINE SILICON THIN FILM

(75) Inventors: Jae-Sang Ro, Seoul (KR); Won-Eui Hong, Seoul (KR)

(73) Assignee: Ensiltech Corporation (KR)

( * ) Notice: Subject to any disclaimer, the term of this patent is extended or adjusted under 35 U.S.C. 154(b) by 28 days.

(21) Appl. No.: 12/864,622

(22) PCT Filed: Jan. 30, 2009

(86) PCT No.: PCT/KR2009/000480
§ 371 (c)(1),
(2), (4) Date: Jul. 26, 2010

(87) PCT Pub. No.: WO2009/096747
PCT Pub. Date: Aug. 6, 2009

(65) Prior Publication Data
US 2010/0313397 A1      Dec. 16, 2010

(30) Foreign Application Priority Data

Jan. 31, 2008   (KR) .................. 10-2008-0010293

(51) Int. Cl.
*H01L 21/00* (2006.01)
(52) U.S. Cl. ........ 29/25.01; 432/120; 432/214; 432/253
(58) Field of Classification Search .......... 438/151–166; 432/120, 214, 253
See application file for complete search history.

(56) References Cited

U.S. PATENT DOCUMENTS

| 6,541,323 | B2 * | 4/2003 | Yang et al. ............... 438/200 |
| 7,449,397 | B2 | 11/2008 | Ro et al. | |
| 2009/0042342 | A1 | 2/2009 | Ro et al. | |

FOREIGN PATENT DOCUMENTS

| KR | 10-2000-0031709 | 6/2000 |
| KR | 10-2002-0031835 | 5/2002 |
| KR | 10-2007-0090849 | 9/2007 |
| WO | 2004/107453 | 12/2004 |
| WO | 2007/100233 | 9/2007 |

OTHER PUBLICATIONS

International Search Report—PCT/KR2009/000480 dated Jul. 30, 2009.
Written Opinion—PCT/KR2009/000480 dated Jul. 30, 2009.

* cited by examiner

*Primary Examiner* — Richard A. Booth
(74) *Attorney, Agent, or Firm* — Cantor Colburn LLP (57) ABSTRACT

Provided is an apparatus for manufacturing a polysilicon thin film by depositing an amorphous silicon thin film and an upper silicon dioxide substrate on a lower silicon dioxide substrate, forming a conductive thin film on the upper silicon dioxide substrate, and applying an electric field and performing Joule heating to crystallize the amorphous silicon thin film, the apparatus comprising power terminals for elastically contacting both upper ends of the conductive thin film and supplying power to the conductive thin film, and support members for elastically supporting the substrate such that the power terminals closely contact both upper ends of the conductive thin film to form a uniform electric field at the conductive thin film. Therefore, it is possible to apply an electric field to a conductive thin film and perform Joule heating to crystallize an amorphous silicon thin film, and support members are installed at both lower surfaces of a silicon dioxide substrate to elastically support the silicon dioxide substrate such that power terminals closely contact both upper ends of the conductive thin film, thereby forming a uniform electric field at the conductive thin film to efficiently perform crystallization within a short time.

10 Claims, 6 Drawing Sheets

APPARATUS FOR MANUFACTURING POLYCRYSTALLINE SILICON THIN FILM

BACKGROUND OF THE INVENTION

1. Field of the Invention

The present invention relates to an apparatus for manufacturing a polysilicon thin film, and more particularly, to an apparatus for manufacturing a polysilicon thin film capable of applying a uniform electric field to a conductive thin film disposed on or under amorphous silicon to form a polysilicon thin film.

2. Description of the Related Art

Generally, amorphous silicon (a-Si) has disadvantages of low mobility and aperture ratios of electrons which are charge carriers and it is not appropriate for a CMOS process. On the contrary, in a polysilicon (poly-Si) thin film transistor (TFT), a drive circuit required for displaying image signals on pixels can be implemented on a substrate together with a pixel TFT-array, which was impossible in an amorphous silicon TFT (a-Si TFT).

Therefore, in the polysilicon thin film transistor, since there is no need for connection between a plurality of terminals and a driver IC, it is possible to increase productivity and reliability and reduce the thickness of a panel.

In addition, in the polysilicon TFT process, since silicon LSI fine machining techniques can be used as is, fine structures can be formed in interconnections, etc. As a result, since there is no pitch restriction upon TAB mounting of the driver IC of the amorphous silicon TFT, pixel size can be readily reduced and a large number of pixels can be formed within a small angle of view.

In comparison with a TFT using amorphous silicon, since a TFT using polysilicon in an active layer has a high switching ability and a channel position of the active layer is determined by self-alignment, element miniaturization and CMOS technology can be implemented. For this reason, the polysilicon TFT is used as a pixel switch device of an active matrix flat panel display, etc. (for example, a liquid crystal display or an organic light emitting diode display device), and plays an important role in practical use of chip-on-glass (COG) products having a large screen and a built-in driver. Methods for manufacturing polysilicon TFTs are classified into high-temperature manufacturing methods and low-temperature manufacturing methods. In order to form polysilicon at a high temperature, expensive materials such as quartz, etc. must be used to form a substrate, which is inappropriate for a large screen. Therefore, mass production of amorphous silicon thin films using polysilicon under low-temperature conditions is actively being researched. The low-temperature polysilicon manufacturing methods may be classified into solid phase crystallization (SPC), metal induced crystallization (MIC), metal induced lateral crystallization (MILC), excimer laser crystallization (ELC), and so on. While SPC can obtain uniform crystalline structure using an inexpensive apparatus, since high crystallization temperature and long time are needed, a substrate having a relative low thermal deformation temperature cannot be used and productivity is low. In the case of SPC, crystallization normally requires annealing of the amorphous silicon thin film for about 1 to 24 hours at a temperature of 600 to 700° C.

In addition, in the case of polysilicon manufactured through SPC, since solid phase change from an amorphous phase to a crystalline phase is accompanied by twin-growth, numerous crystal lattice defects are contained in the resultant crystal grains. These factors reduce mobility of electrons and holes of the manufactured polysilicon TFT and increase a threshold voltage. MIC has the advantage of placing amorphous silicon in contact with specific metals so that crystallization can be performed at a substantially lower temperature than the crystallization temperature of SPC.

Metals that can be used in MIC may include Ni, Pd, Ti, Al, Ag, Au, Co, Cu, Fe, Mn, etc. These metals react with amorphous silicon to form a eutectic phase or a silicide phase, promoting low-temperature crystallization. However, when MIC is applied to a process of manufacturing a polysilicon TFT, metal contamination in a channel may be severe.

MILC is an application of MIC. After forming a gate electrode instead of depositing metal on the channel, the metal is thinly deposited on a source and drain of a self-aligned structure to cause metal induced crystallization, thereby inducing lateral crystallization toward the channel.

Metals most widely used in MILC may include Ni and Pd. While polysilicon manufactured through MILC has better crystallization and higher field effect mobility than polysilicon manufactured through SPC, it may exhibit high leakage current characteristics. That is, while metal contamination is reduced in comparison with MIC, some unsolved problems remain.

Meanwhile, field aided lateral crystallization (FALC) is an improvement over MILC. While FALC is characterized by high crystallization speed and anisotropy in a crystallization direction compared to MILC, it is also unable to completely solve the contamination problem. While crystallization methods such as MIC, MILC, FALC, and so on are effective in that they reduce crystallization temperature, crystallization time is still long and crystallization is induced by all metals. Therefore, they are not free from metal contamination.

A recently developed excimer laser crystallization (ELC) method can solve the problem of metal contamination and manufacture a polysilicon thin film on a glass substrate through a low-temperature process. Since an amorphous silicon thin film deposited through low pressure chemical vapor deposition (LPCVD) or plasma enhanced chemical vapor deposition (PECVD) has a large absorption coefficient at the wavelength of an excimer laser in the infrared region ($\lambda=308$ nm), the amorphous silicon thin film can be readily melted at an appropriate energy density. When the amorphous silicon thin film is crystallized by the excimer laser, melting and solidification are performed for a very short time. From this point of view, the ELC method is not a low-temperature process in a strict sense. However, in the ELC method, since polysilicon is crystallized by rapid melting and solidification in a local region largely affected by an excimer laser, it is possible to manufacture polysilicon for a very short time (tens of nanoseconds) without damage to the substrate. That is, when a laser irradiates the amorphous silicon of a mother substrate formed of a glass substrate/insulating layer/amorphous silicon thin film for a very short time, only the amorphous silicon thin film is selectively heated to crystallize the glass substrate disposed at a lowermost layer without damage. In addition, since polysilicon generated upon phase change from liquid phase to solid phase exhibits a thermally stable crystal grain structure and remarkably reduces crystal defects in crystal grains in comparison with polysilicon generated through solid phase crystallization, polysilicon manufactured through the ELC method exhibits better characteristics than polysilicon manufactured through the other crystallization methods. Nevertheless, the ELC method has several important disadvantages, for example, a laser system problem of nonuniform laser beam irradiation, a laser process problem of a process region of an energy density for obtaining coarse crystal grains being extremely limited, and a problem of shot marks remaining in a large area. These problems lead to nonuniform crystal grain size in a polysilicon thin film constituting an active layer of a polysilicon TFT. In addition, since phase change of polysilicon from liquid phase to solid phase is accompanied by expansion of volume, a severe protrusion phenomenon occurs from a position where a grain boundary is formed to the surface. This phenomenon directly affects a gate insulating layer formed in a post process, which has adverse affects on device reliability such as breakdown voltage reduction due to unevenness of a polysilicon/gate insulating layer interface and hot carrier stress, etc. While a sequential lateral solidification (SLS) method was recently developed to overcome instability of the ELC method, and the process region of the laser energy density was successfully stabilized, shot marks and the protrusion phenomenon remain unsolved. In addition, in light of the rapid development of the flat panel display industry, there are still problems with techniques employing a laser in a crystallization process of a substrate having a size of 1 m×1 m or more which will need to be mass-produced in the near future. Moreover, since equipment for performing ELC and SLS methods is very expensive, an initial investment and maintenance costs are high.

In order to solve these problems, in Korean Patent Application No. 2007-0021252, the present inventors disclose a method of disposing a conductive thin film on or under a silicon thin film and applying an electric field to the conductive thin film to perform Joule heating, thereby achieving crystallization.

Figure 1:
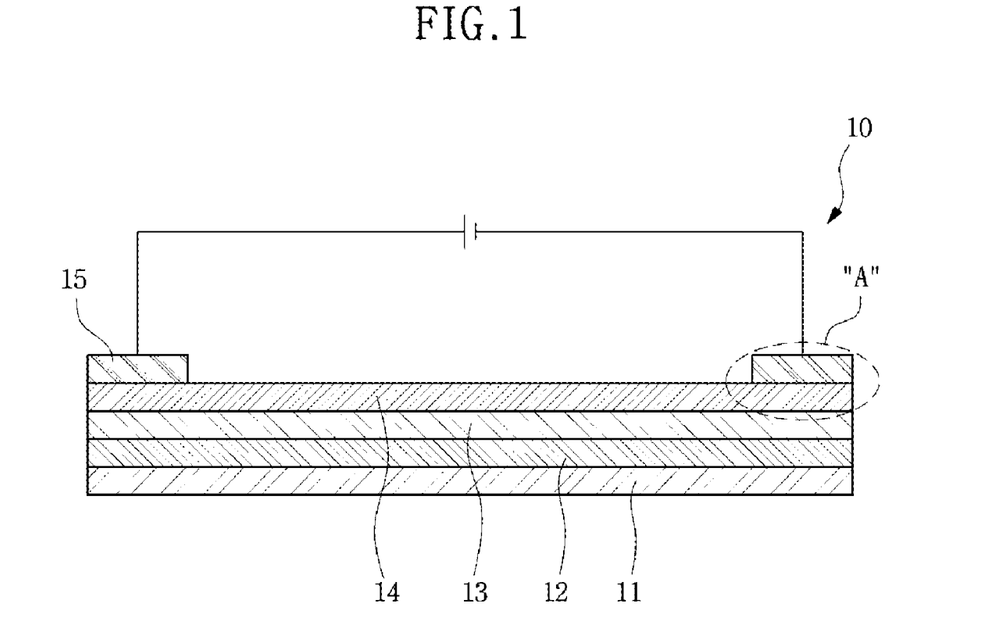
FIG. 1 is a longitudinal cross-sectional view of a conventional apparatus for manufacturing a polysilicon thin film.
Figure 2:
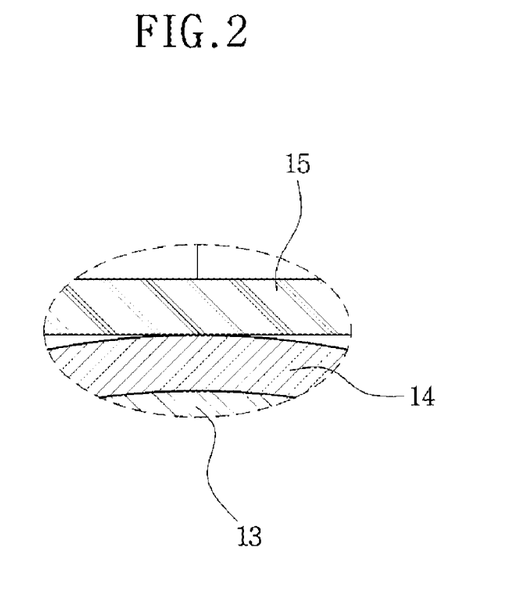
FIG. 2 is an enlarged view of "A" of FIG. 1.

FIG. 1 is a longitudinal cross-sectional view of a polysilicon thin film manufacturing apparatus, and FIG. 2 is an enlarged view of "A" of FIG. 1.

Referring to FIGS. 1 and 2, in the conventional polysilicon thin film manufacturing apparatus 10, an amorphous silicon thin film 12 and an upper silicon dioxide substrate 13 are deposited on a lower silicon dioxide substrate 11, and a conductive thin film 14 is formed on the upper silicon dioxide substrate 13.

An electric field is applied to the silicon dioxide substrates 11 and 13 and the amorphous silicon thin film 12 through electrode terminals 15 installed at both upper ends of the conductive thin film 14, and Joule heating is performed to crystallize the amorphous silicon thin film 12.

However, during the conventional polysilicon thin film crystallization process, a large amount of heat generated by Joule heating deforms the substrate. When a power terminal cannot uniformly contact a conductive thin film due to deformation of a silicon dioxide substrate, a uniform electric field cannot be formed, which makes it difficult to form a good polysilicon thin film.

SUMMARY OF THE INVENTION

In order to solve the foregoing and/or other problems, it is an aspect of the present invention to provide an apparatus for manufacturing a polysilicon thin film capable of applying an electric field to a conductive thin film and performing Joule heating to crystallize an amorphous silicon thin film, wherein support members are installed at both lower surfaces of a silicon dioxide substrate to elastically support the silicon dioxide substrate such that power terminals closely contact both upper ends of the conductive thin film, thereby forming a uniform electric field at the conductive thin film to efficiently perform crystallization within a short time.

It is another aspect of the present invention to provide an apparatus for manufacturing a polysilicon thin film capable of efficiently manufacturing a polysilicon thin film providing good crystallization, dopant activation, and thermal oxidation layer process characteristics, and few crystal grain defects.

The foregoing and/or other aspects of the present invention may be achieved by providing an apparatus for manufacturing a polysilicon thin film by depositing an amorphous silicon thin film and an upper silicon dioxide substrate on a lower silicon dioxide substrate, forming a conductive thin film on the upper silicon dioxide substrate, and applying an electric field and performing Joule heating to crystallize the amorphous silicon thin film, the apparatus comprising power terminals for elastically contacting both upper ends of the conductive thin film and supplying power to the conductive thin film; and support members for elastically supporting the substrate such that the power terminals closely contact both upper ends of the conductive thin film to form a uniform electric field at the conductive thin film.

The support member may be an elastic member formed of any one selected from sponge, rubber, and a spring.

The power terminal may include a housing; a plurality of rooms formed in the housing; and lift terminal parts installed in the rooms to be elastically raised and lowered.

A spring may be installed in the housing. In addition, a stopper may be formed at an end of the housing.

BRIEF DESCRIPTION OF THE DRAWINGS

The above and other aspects and advantages of the present invention will become apparent and more readily appreciated from the following description of exemplary embodiments, taken in conjunction with the accompanying drawings of which.

DESCRIPTION OF MAJOR REFERENCE NUMERALS

11: Lower silicon dioxide substrate
12: Amorphous silicon thin film
13: Upper silicon dioxide substrate
14: Conductive thin film
100: Apparatus for manufacturing polysilicon thin film
110: Power terminal
111: Housing
113: Room
115: Lift terminal part
117: Spring
119: Stopper
120: Support member
130: Power supply
211a: Guide groove
215a: Guide projection

DETAILED DESCRIPTION OF THE INVENTION

Reference will now be made in detail to exemplary embodiments of the present invention, examples of which are illustrated in the accompanying drawings.

Figure 3:
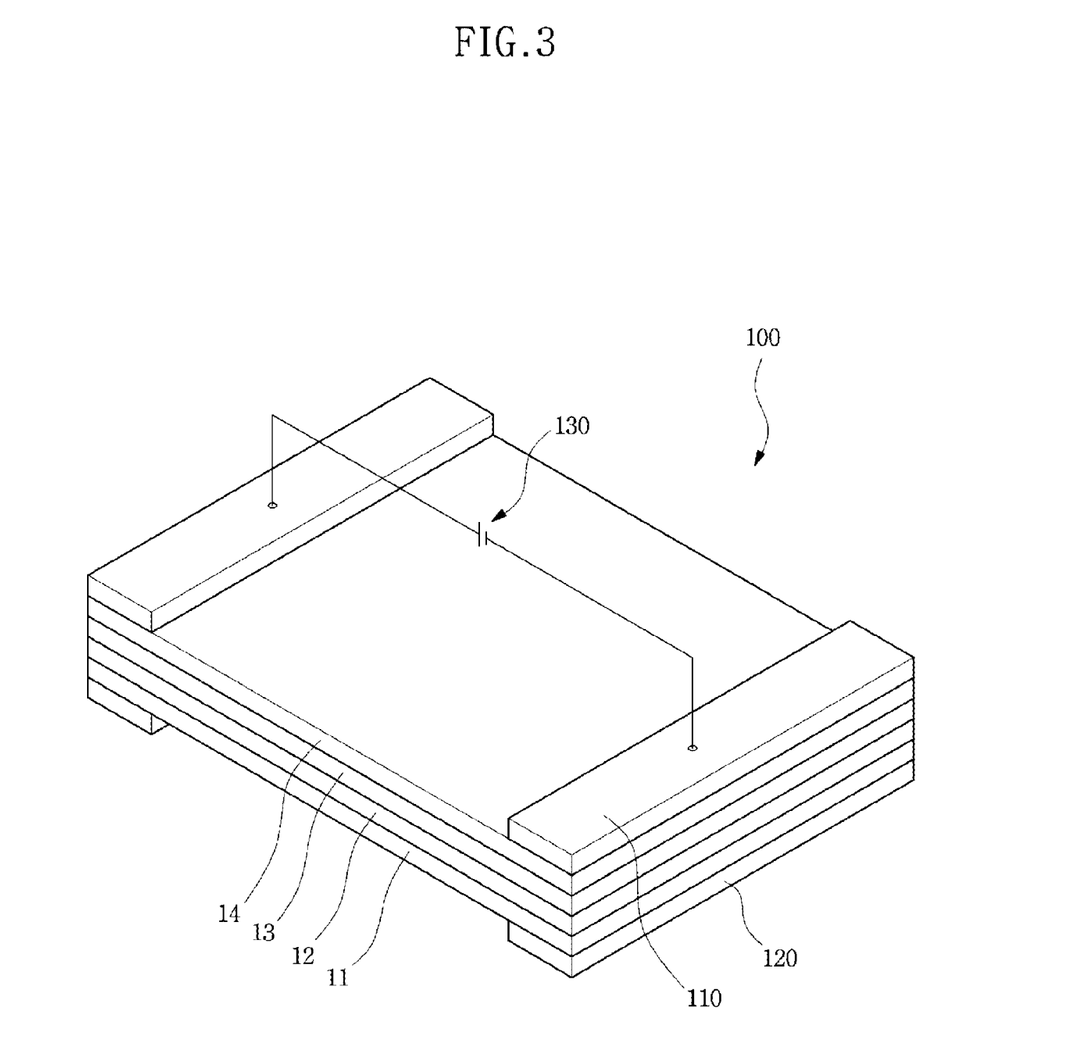
FIG. 3 is a perspective view of an apparatus for manufacturing a polysilicon thin film in accordance with a first exemplary embodiment of the present invention.
Figure 4:
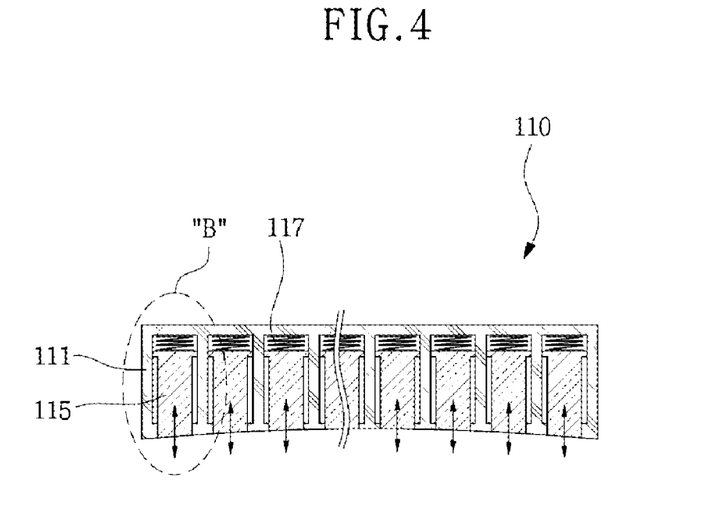
FIG. 4 is a longitudinal cross-sectional view of a power terminal of FIG. 3.
Figure 5:
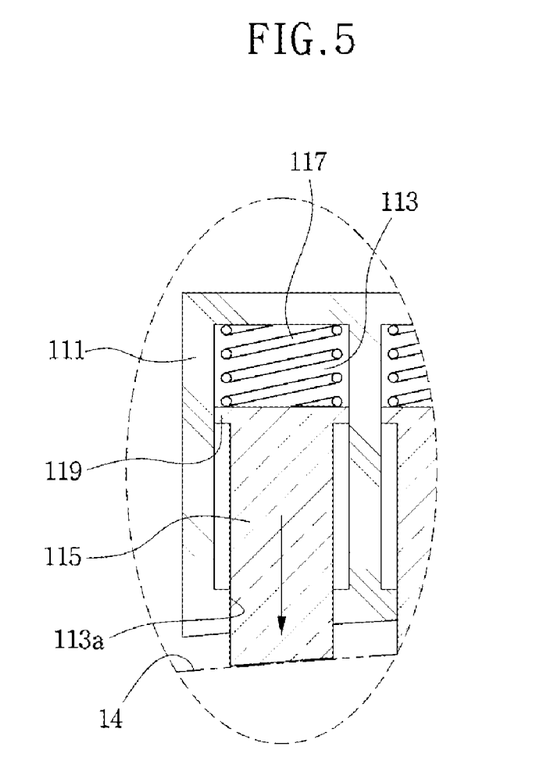
FIG. 5 is an enlarged view of "B" of FIG. 4.

FIG. 3 is a perspective view of an apparatus for manufacturing a polysilicon thin film in accordance with a first exemplary embodiment of the present invention, FIG. 4 is a longitudinal cross-sectional view of a power terminal of FIG. 3, and FIG. 5 is an enlarged view of "B" of FIG. 4.

Referring to FIGS. 3 to 5, an apparatus 100 for manufacturing a polysilicon thin film in accordance with a first exemplary embodiment of the present invention is an apparatus for depositing an amorphous silicon thin film 12 and an upper silicon dioxide substrate 13 on a lower silicon dioxide substrate 11, forming a conductive thin film 14 on the upper silicon dioxide substrate 13, and applying an electric field to the silicon dioxide substrates 11 and 13 and the amorphous silicon thin film 12 through power terminals 110 installed at both upper ends of the conductive thin film 14 and performing Joule heating to crystallize the amorphous silicon thin film 12.

The apparatus 100 for manufacturing a polysilicon thin film in accordance with a first exemplary embodiment of the present invention includes the power terminals 110 for elastically contacting both upper ends of the conductive thin film 14 and supplying power to the conductive thin film 14. The power terminals 110 are connected to a power supply 130.

Support members 120 formed of sponge, rubber or a spring and elastically supporting the lower silicon dioxide substrate 11 may be installed at both lower ends of the lower silicon dioxide substrate 11 such that the power terminals 110 closely contact both upper ends of the conductive thin film 14 to form a uniform electric field at the conductive thin film 14.

Each power terminal 110 includes a housing 111, a plurality of rooms 113 formed in the housing 111, and lift terminal parts 115 installed in the rooms 113 to be elastically raised and lowered.

Referring to FIG. 5, springs 117 may be positioned in the rooms 113 of the housing 111, and stoppers 119 may extend outwardly by a predetermined length from upper ends of the lift terminal parts 115 and closely contact inner walls of the rooms 113.

The springs 119 are disposed in the rooms 113 to provide mutual elastic support between interior upper walls of the rooms 113 and the upper ends of the lift terminal parts 115 having the stoppers 119 formed thereon.

Exposure holes 113a are formed in a lower end of the housing 111 to expose the plurality of rooms 113 to the exterior. The exposure holes 113a are in communication with the rooms 113.

The lift terminal parts 115 are disposed to move freely within the rooms 113. Lower ends of the lift terminal parts 115 may be exposed to the exterior through the exposure holes 113a.

In the apparatus 100 for manufacturing a polysilicon thin film in accordance with a first exemplary embodiment of the present invention as described above, power is supplied from the power supply 130 to apply an electric field to the conductive thin film 14 through the power terminals 110. At this time, the support members 120 elastically support both lower ends of the lower silicon dioxide substrate 11 and are appropriately deformed depending on deformation of a substrate of the power terminals 110 so that the electric field is uniformly applied to the entire substrate to form a high-quality polysilicon thin film, even when the silicon dioxide substrates 11 and 13 are somewhat deformed during Joule heating.

In other words, even when the substrates 11 and 13 are deformed during Joule heating, since the lift terminal parts 115 are elastically supported by the springs 117, the lift terminals 115 are disposed along the deformed surface of the substrate to be in uniform contact with the conductive thin film 14.

Here, the stoppers 119 function to prevent the lift terminal parts 115 raised and lowered in the rooms 113 of the housing 111 from arbitrarily separating therefrom.

Of course, materials for the upper and lower silicon dioxide substrates 11 and 13 are not limited; for example, transparent materials such as glass, quartz, plastic, etc. may be used, glass being preferable from an economic point of view. However, a review of recent research in the flat panel display field reveals considerable research into plastic materials having good impact resistance and productivity, and the present invention can be applied to these plastic materials as well.

The conductive thin film 14 is a thin layer formed of a conductive material by, for example, methods such as sputtering, evaporation, and so on. The conductive thin film 14 is required to have a uniform thickness in order to be uniformly heated during subsequent Joule heating by application of an electric field. The amorphous silicon thin film 12 may be formed by methods such as low pressure chemical vapor deposition (LPCVD), atmospheric pressure chemical vapor deposition (APCVD), plasma enhanced chemical vapor deposition (PECVD), sputtering, vacuum evaporation, etc., however preferably PECVD. The thickness of the amorphous silicon thin film may be 300 to 1000Å, but is not limited thereto.

Before application of the electric field to the conductive thin film 14, the silicon dioxide substrates 11 and 13 may be preheated to an appropriate temperature range. The appropriate temperature range means a temperature range in which the silicon dioxide substrates 11 and 13 are not damaged throughout the process, and is preferably lower than a thermal deformation temperature of the silicon dioxide substrates 11 and 13. The preheating method is not limited; for example, insertion into conventional heat treatment furnaces, heat irradiation by lamps, etc., can be used. An electric field is applied to the conductive thin film 14 by applying energy having a power density that can generate a substantially large amount of heat to induce crystallization of the amorphous silicon thin film 12 through Joule heating. However, since the electric field is determined by various factors such as conductive resistance, length, thickness, etc., of the conductive thin film 12, it cannot be readily specified. The applied current may be direct current or alternating current. Continuous application time of the electric field may be $1/1,000,000$ to 10 seconds, and preferably $1/1,000,000$ to 1 second.

This application of the electric field may be repeated regularly or irregularly several times. Therefore, while the total heat treatment time may be larger than the electric field application time, it is substantially shorter than in conventional crystallization methods. If necessary, relative positions of the conductive thin film 13 and the amorphous silicon thin film 12 may be changed.

Figure 6:
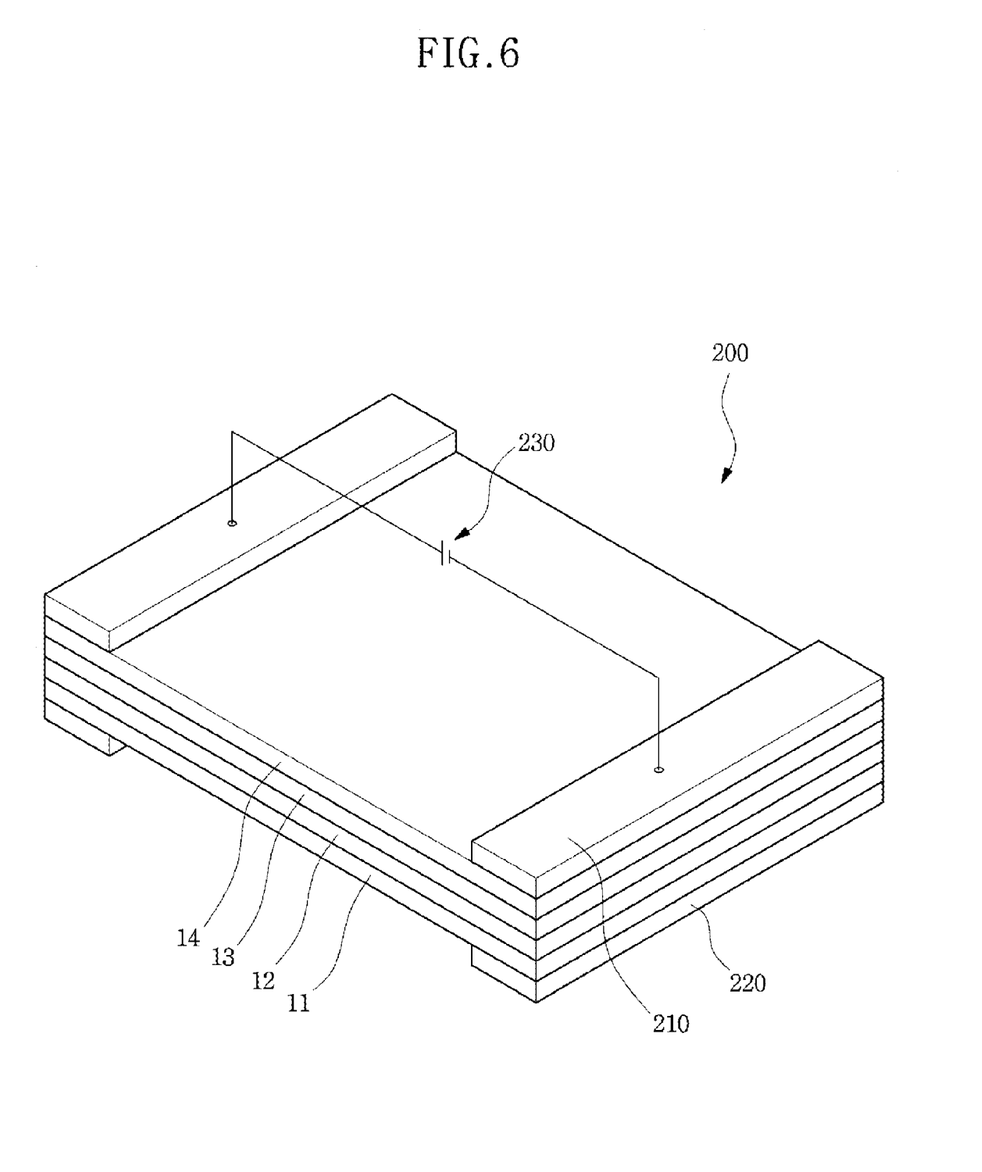
FIG. 6 is a perspective view of an apparatus for manufacturing a polysilicon thin film in accordance with a second exemplary embodiment of the present invention.
Figure 7:
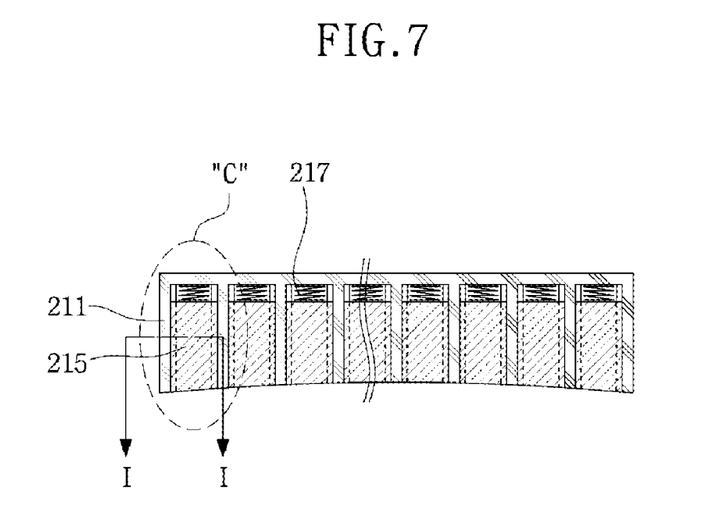
FIG. 7 is a longitudinal cross-sectional view of a power terminal of FIG. 6.
Figure 8:
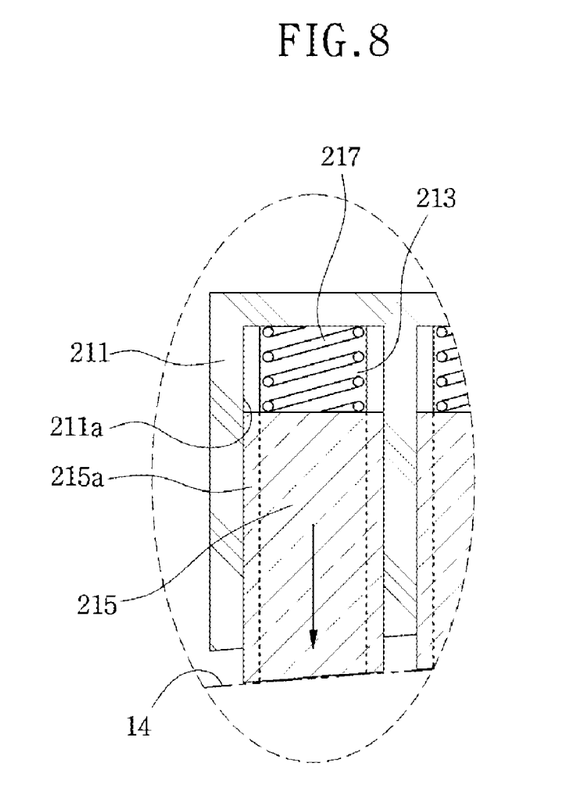
FIG. 8 is an enlarged view of "C" of FIG. 7.
Figure 9:
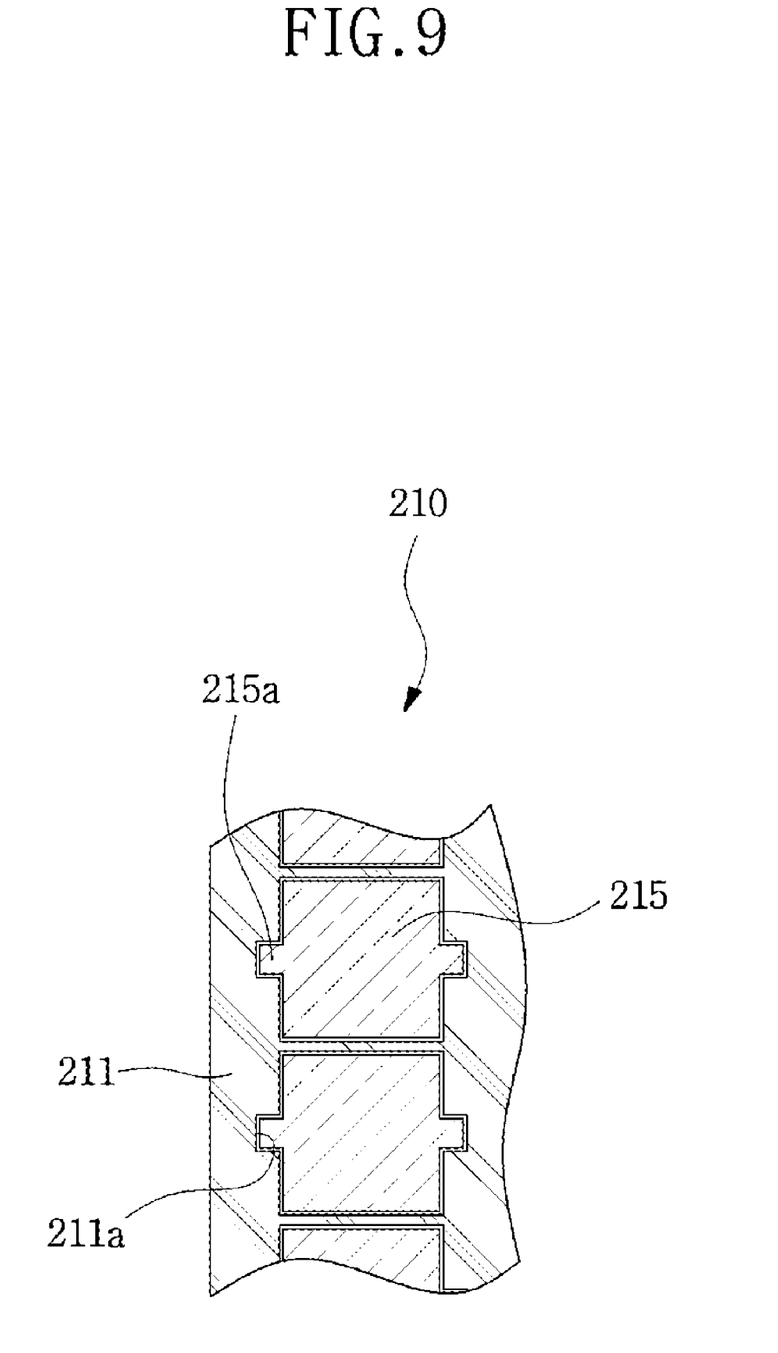
FIG. 9 is a cross-sectional view taken along line I-I of FIG. 7.

FIG. 6 is a perspective view of an apparatus for manufacturing a polysilicon thin film in accordance with a second exemplary embodiment of the present invention, FIG. 7 is a longitudinal cross-sectional view of a power terminal of FIG. 6, FIG. 8 is an enlarged view of "C" of FIG. 7, and FIG. 9 is a cross-sectional view taken along line I-I of FIG. 7.

Referring to FIGS. 6 to 9, an apparatus 200 for manufacturing a polysilicon thin film in accordance with a second exemplary embodiment of the present invention is an apparatus for depositing an amorphous silicon thin film 12 and an upper silicon dioxide substrate 13 on a lower silicon dioxide substrate 11, forming a conductive thin film 14 on the upper silicon dioxide substrate 13, and applying an electric field to the silicon dioxide substrates 11 and 13 and the amorphous silicon thin film 12 through power terminals 110 installed at both upper ends of the conductive thin film 14 and performing Joule heating to crystallize the amorphous silicon thin film 12.

The apparatus 200 for manufacturing a polysilicon thin film in accordance with a second exemplary embodiment of the present invention includes the power terminals 210 for elastically contacting both upper ends of the conductive thin film 14 and supplying power to the conductive thin film 14. The power terminals 210 are connected to a power supply 230.

Support members 120 formed of sponge, rubber or a spring and elastically supporting the lower silicon dioxide substrate 11 may be installed at both lower ends of the lower silicon dioxide substrate 11 such that the power terminals 210 closely contact both upper ends of the conductive thin film 14 to form a uniform electric field at the conductive thin film 14.

Each power terminal 210 includes a housing 211, a plurality of rooms 213 formed in the housing 211, and lift terminal parts 215 installed in the rooms 213 to be elastically raised and lowered.

A guide groove 211a is formed in an inner surface of the housing 211, and a guide projection 215a is formed at an outer surface of the lift terminal part 215.

In the apparatus 200 for manufacturing a polysilicon thin film in accordance with a first exemplary embodiment of the present invention as described above, power is supplied from the power supply 230 to apply an electric field to the conductive thin film 14 through the power terminals 210. At this time, the support members 220 elastically support both lower ends of the lower silicon dioxide substrate 11 and are appropriately deformed depending on deformation of a substrate of the power terminals 210 so that the electric field is uniformly applied to the entire substrate to form a high-quality polysilicon thin film, even when the silicon dioxide substrates 11 and 13 are somewhat deformed during Joule heating.

In other words, even when the substrates 11 and 13 are deformed during Joule heating, since the lift terminal parts 215 are elastically supported by springs 217, the lift terminals 215 are disposed along the deformed surface of the substrate to be in uniform contact with the conductive thin film 14.

That is, the guide grooves 211a are formed in the inner surface of the housing 211 and the guide projections 215a are formed at the outer surfaces of the lift terminal parts 215 so that the lift terminals 215 can be more smoothly raised or lowered to uniformly contact the conductive thin film 14.

As can be seen from the foregoing, an apparatus for manufacturing a polysilicon thin film can apply an electric field to a conductive thin film and perform Joule heating to crystallize an amorphous silicon thin film, wherein support members are installed at both lower surfaces of a silicon dioxide substrate to elastically support the silicon dioxide substrate such that power terminals closely contact both upper ends of the conductive thin film, thereby forming a uniform electric field at the conductive thin film to efficiently perform crystallization within a short time. In addition, the apparatus for manufacturing a polysilicon thin film has various applications, and can efficiently manufacture a polysilicon thin film providing good crystallization, dopant activation, and thermal oxidation layer process characteristics, and few crystal grain defects.

The foregoing description concerns exemplary embodiments of the invention, is intended to be illustrative, and should not be construed as limiting the invention. Many alternatives, modifications, and variations within the scope and spirit of the present invention will be apparent to those skilled in the art.

As can be seen from the foregoing, an apparatus for manufacturing a polysilicon thin film is capable of applying an electric field to a conductive thin film and performing Joule heating to crystallize an amorphous silicon thin film, wherein support members are installed at both lower surfaces of a silicon dioxide substrate to elastically support the silicon dioxide substrate such that power terminals closely contact both upper ends of the conductive thin film, thereby forming a uniform electric field at the conductive thin film to efficiently perform crystallization within a short time.

In addition, since various kinds of support members such as sponge, rubber, a spring, and so on, can be used and a bottom shape of a power terminal can be deformed such that the power terminal closely contacts both upper ends of the conductive thin film, it is possible to efficiently manufacture a polysilicon thin film providing good crystallization, dopant activation, and thermal oxidation layer process characteristics, and few crystal grain defects.

What is claimed is:

1. An apparatus for manufacturing a polysilicon thin film by performing Joule heating by applying an electric field to a conductive thin film,
the apparatus comprising: power terminals for elastically contacting both upper ends of the conductive thin film and supplying power to the conductive thin film.

2. The apparatus for manufacturing the polysilicon thin film according to claim 1, the apparatus further comprising: a lower silicon dioxide substrate; an amorphous silicon thin film on the lower silicon dioxide substrate; and an upper silicon dioxide substrate on the amorphous silicon thin film,
wherein the conductive thin film is formed on the upper silicon dioxide substrate.

3. The apparatus for manufacturing the polysilicon thin film according to claim 2, the apparatus further comprising: support members formed at a lower end of the lower silicon dioxide substrate,
wherein the support members elastically support the lower silicon dioxide substrate such that the power terminals closely contact both upper ends of the conductive thin film to form a uniform electric field at the conductive thin film.

4. The apparatus for manufacturing the polysilicon thin film according to claim 3, wherein the support member is an elastic member.

5. The apparatus for manufacturing the polysilicon thin film according to claim 4, wherein the elastic member is formed of any one selected from sponge, rubber, and a spring.

6. The apparatus for manufacturing the polysilicon thin film according to claim 1, wherein the power terminal comprises:
a housing;
a plurality of rooms formed in the housing; and
lift terminal parts installed in the rooms to be elastically raised and lowered.

7. The apparatus for manufacturing the polysilicon thin film according to claim 6, wherein a spring is installed in the housing.

8. The apparatus for manufacturing the polysilicon thin film according to claim 6, wherein a stopper is formed at an end of the housing.

9. The apparatus for manufacturing the polysilicon thin film according to claim 7, wherein a stopper is formed at an end of the housing.

10. The apparatus for manufacturing the polysilicon thin film according to claim 6, wherein a guide groove is formed in an inner surface of the housing, and a guide projection is formed at an outer surface of the lift terminal part.

* * * * *